US005714286A

United States Patent [19]
Uchikawa et al.

[11] Patent Number: 5,714,286
[45] Date of Patent: Feb. 3, 1998

[54] PHOTOSENSITIVE RESIN COMPOSITION FOR FORMING LIGHT SHIELDING FILMS, BLACK MATRIX FORMED BY THE SAME, AND METHOD FOR THE PRODUCTION THEREOF

[75] Inventors: Kiyoshi Uchikawa, Koza-gun; Masaru Shida, Sagamihara; Hiroshi Komano, Koza-gun, all of Japan

[73] Assignee: Tokyo Ohka Kogyo Co., Ltd., Kanagawa, Japan

[21] Appl. No.: 759,716

[22] Filed: Dec. 6, 1996

[30] Foreign Application Priority Data

Dec. 9, 1995 [JP] Japan .................................. 7-345613

[51] Int. Cl.[6] ........................................................... G03F 9/00
[52] U.S. Cl. ........................... 430/6; 430/20; 430/281.1; 430/325; 430/330
[58] Field of Search ........................ 430/6, 20, 281.1, 430/325, 330

[56] References Cited

U.S. PATENT DOCUMENTS 4,647,153  3/1987  Utsumi et al. .................. 350/96.25
5,418,094  5/1995  Sato et al. ........................ 430/20

*Primary Examiner*—Christopher G. Young
*Attorney, Agent, or Firm*—Finnegan, Henderson, Farabow, Garrett & Dunner, L.L.P.

[57] ABSTRACT

A photosensitive resin composition for forming light shielding films is of particular utility in forming a black matrix for use in display elements such as of a CRT display, a liquid crystal panel, a plasma display and the like. The photosensitive resin composition is comprised of a photopolymerizable compound, a photopolymerization initiator, and light shielding materials composed of an oxide of copper and an oxide or oxides of at least one metal selected from iron, manganese, chromium, cobalt and nickel. The black matrix so obtained is conducive to high heat resistance, greatly light shielding and sharp image contrast as well as to excellent electrical insulation resistance. For use in the plasma display in particular, a black matrix is producible by coating of the photosensitive resin composition on a given substrate, followed by exposure of the coat to selective irradiation with active light rays to form a pattern therein and by subsequently burning of the pattern.

14 Claims, No Drawings

PHOTOSENSITIVE RESIN COMPOSITION FOR FORMING LIGHT SHIELDING FILMS, BLACK MATRIX FORMED BY THE SAME, AND METHOD FOR THE PRODUCTION THEREOF

BACKGROUND OF THE INVENTION

1. Field of the Invention

The present invention relates to a photosensitive resin composition for forming light shielding films, a black matrix formed by said photosensitive resin composition, and a method for the production thereof. More particularly, the invention is directed to a photosensitive resin composition for forming light shielding films suited to provide a highly heat-resistant, electrical insulating and a light shielding black matrix for use in plasma display panels and the like, to such a black matrix obtainable from said photosensitive resin composition, and also to a method for producing such black matrix.

2. Description of the Related Art

In the production of display elements such as of a CRT display, a liquid crystal panel and the like, black matrices have heretofore been used to present a sharp contrast to images to be formed therein. To this end, certain photosensitive resin compositions are in common use which are of a carbon black-containing type.

In this technical field, however, a plasma display panel (referred to hereinafter as "PDP") has of late been improved to such an extent as to favorably compete in illuminating luminance with the CRT display. Thus, the PDP has been highly reputed and intensively studied by virtue of its relatively simple structure as well as its possible production in large configuration with compact equipment. It has been investigated whether or not the PDP would be likewise receptive to the photosensitive resin composition for forming light shielding films noted above in regard to the black matrices for use in the CRT display, liquid crystal panel and the like. It has been found, as a result of those investigatons, that a black matrix satisfactory for PDP is difficult to attain with such photosensitive resin composition. This is partly due to the fact that the production of PDP requires a burning step to be conducted at from 350° to 750° C., in which carbon black in the photosensitive resin composition is ultimately decomposed. Another reason is that since carbon black has high electric conductivity in nature, the black matrix formed by the carbon black-based type of light shielding photosensitive resin composition tends to cause current leakage. This makes it difficult to apply voltage in even or stable condition to the associated panel, failing to achieve regular or appropriate image formation.

To solve those problems, a modified form of light shielding film forming photosensitive resin composition has been proposed in which an. inorganic pigment of high heat resistance such as titanium black is substituted for carbon black. The titanium black-based type of light shielding film-forming photosensitive resin composition is capable of producing a black matrix, but with poorer light shielding, than the carbon black-based equivalent so that a desirable achromatic black matrix is unfeasible.

With the foregoing drawbacks of the prior art in view, the present inventors have made continued research and found that a black matrix of excellent performance characteristics can be obtained by the use of a selected photosensitive resin composition combined with a specified group of metallic oxides. Advantageously, such black matrix is high in heat resistance and great in light shielding. The present invention has been completed based on those findings.

SUMMARY OF THE INVENTION

The present invention, therefore, has for one of its objects to provide a photosensitive resin composition for forming light shielding films which enables formation of a black matrix having high heat resistance and great light shielding.

Another object of the invention is to provide a black matrix which is highly resistant to heat and greatly capable of light shielding and besides is fully free from current leak.

A still another object of the invention is to provide a process for the production of such black matrix using such photosensitive resin composition.

More specifically, this invention in one important aspect permits the provision of a photosensitive resin composition for forming light shielding films comprising a photopolymerizable compound, a photopolymerization initiator, and light-shielding materials composed of an oxide of copper and an oxide or oxides of at least one metal selected from the group consisting of iron, manganese, chromium, cobalt and nickel.

In another aspect, the invention provides a black matrix comprising a metallic oxide layer formed of a photosensitive resin composition for forming light shielding films comprising a photopolymerizable compound, a photopolymerization initiator, and light shielding materials composed of an oxide of copper and an oxide or oxides of at least one metal selected from the group consisting of iron, manganese, chromium, cobalt and nickel.

In a further aspect, the invention provides a method for producing a black matrix, which method comprises the steps of: coating a photosensitive resin composition for forming light shielding films onto a substrate, the resin composition comprising a photopolymerizable compound, a photopolymerization initiator, and light shielding materials composed of an oxide of copper and an oxide or oxides of at least one metal selected from the group consisting of iron, manganese, chromium, cobalt and nickel; drying the resultant coat; exposing the dried coat to selective irradiation with active light rays; and subsequently developing the exposed coat to form a pattern therein.

In a still another aspect, the invention provides a method for producing a black matrix for use in PDP, which method comprises the steps of: coating a photosensitive resin composition for forming light shielding films onto a substrate, the resin composition comprising a photopolymerizable compound, a photopolymerization initiator, and light shielding materials composed of an oxide of copper and an oxide or oxides of at least one metal selected from the group consisting of iron, manganese, chromium, cobalt and nickel; drying the resultant coat; exposing the dried coat to selective irradiation with active light rays; developing the exposed coat to form a pattern therein; and subsequently burning the resultant pattern at a temperature of 350° to 750° C.

The above and other objects, features and advantages of the present invention will be apparent to those versed in the art from the following detailed description.

DESCRIPTION OF THE PREFERRED EMBODIMENTS

The photosensitive resin composition for forming light shielding films according to the present invention is comprised of a photopolymerizable compound as an essential component. Preferred for use as this component are those compounds having an ethylenically unsaturated double bond contained in the molecule. Suitable photopolymerizable compounds used herein include monomers or oligomers such as of acrylic acid, methacrylic acid, fumaric acid, maleic acid, monomethyl fumarate, monoethyl fumarate, 2-hydroxyethyl acrylate, 2-hydroxyethyl methacrylate, ethylene glycol monomethyl ether acrylate, ethylene glycol monomethyl ether methacrylate, ethylene glycol monoethyl ether acrylate, ethylene glycol monoethyl ether methacrylate, glycerol acrylate, glycerol methacrylate, acrylamide, methacrylamide, acrylonitrile, methacrylonitrile, methyl acrylate, methyl methacrylate, ethyl acrylate, ethyl methacrylate, isobutyl acrylate, isobutyl methacrylate, 2-ethylhexyl acrylate, 2-ethylhexyl methacrylate, benzyl acrylate, benzyl methacrylate, ethylene glycol diacrylate, ethylene glycol dimethacrylate, triethylene glycol diacrylate, triethylene glycol dimethacrylate, tetraethylene glycol diacrylate, tetraethylene glycol dimethacrylate, butylene glycol dimethacrylate, propylene glycol diacrylate, propylene glycol dimethacrylate, trimethylolpropane triacrylate, trimethylolpropane trimethacrylate, tetramethylolpropane tetraacrylate, tetramethylolpropane tetramethacrylate, pentaerythritol triacrylate, pentaerythritol trimethacrylate, pentaerythritol tetraacrylate, pentaerythritol tetramethacrylate, dipentaerythritol pentaacrylate, dipentaerythritol pentamethacrylate, dipentaerythritol hexaacrylate, dipentaerythritol hexamethacrylate, 1,6-hexanediol diacrylate, 1,6-hexanediol dimethacrylate, cardoepoxy diacrylate and the like; polyester (meth)acrylates resulting from reaction of (meth)acrylic acid with a polyester prepolymer derived by condensing a polyhydric alcohol and a monobasic or polybasic acid; and polyurethane (meth)acrylates resulting from reaction of (meth)acrylic acid with a reaction product a compound containing a polyol group and a compound containing two isocyanate groups; epoxy (meth)acrylate resins resulting from reaction of (meth)acrylic acid with an epoxy resin such as bisphenol A epoxy resin, bisphenol F epoxy resin, bisphenol S epoxy resin, phenol or cresol novolac epoxy resin, resol epoxy resin, triphenolmethane epoxy resin, polycarboxylate polyglycidyl ester, polyol polyglycidyl ester, aliphatic or alicyclic epoxy resin, amine epoxy resin, dihydroxybenzene epoxy resin or the like. Also chosen for suitable use are resins available from reaction of the above epoxy (meth)acrylates with polybasic acid anhydrides.

The photopolymerizable compound is added preferably in an amount of 60 to 99.9 parts by weight in a total of 100 parts by weight of such compound and a photopolymerization initiator. If the content of the photopolymerizable compound is less than 60 parts by weight, high heat resistance and high chemical resistance cannot be achieved. If the content of the photopolymerizable compound exceeds 99.9 parts by weight, either film formation becomes poor, or in some cases photohardening of the composition is impaired.

Suitable photopolymerization initiators used in this invention are chosen from among 1-hydroxycyclohexyl phenylketone, 2,2-dimethoxy-1,2-diphenylethane-1-one, 2-methyl-1-[4-(methylthio)phenyl-2-morpholinopropane-1-one, 2-benzyl-2-dimethylamino-1-(4-morpholinophenyl)-butane-1-one, 2-hydroxy-2-methyl-1-phenylpropane-1-one, 2,4,6-trimethyl benzoyldiphenyl phosphone oxide, 1-[4-(2-hydroxyethoxy)-phenyl]-2-hydroxy-2-methyl-1-propane-1-one, 1-(4-dodecylphenyl)-2-hydroxy-2-methyl-1-propane-1-one, 2,4-diethylthioxanthone, 2-chlorothioxanthone, 2,4-dimethylthioxanthone, 3,3-dimethyl-4-methoxybenzophenone, benzophenone, 1-chloro-4-propoxythioxanthone, 1-(4-isopropylphenyl)-2-hydroxy-2-methylpropane-1-one, 4-benzoyl-4'-methyldimethyl sulfide, 4-dimethylaminobenzoic acid, 4-dimethylaminomethyl benzoate, 4-dimethylaminoethyl benzoate, 4-dimethylaminobutyl benzoate, 4-dimethylamino-benzoate-2-ethylhexyl, 4-dimethylamino-benzoate-2-isoamyl, 2,2-diethoxyactophenone, benzyldimethylketal, benzyl-β-methoxyethylacetal, 1-phenyl-1,2-propanedione-2-(o-ethoxycarbonyl)oxime, o-benzoyl-methyl benzoate, bis (4-dimethyl-aminophenyl)ketone, 4,4'-bisdiethylaminobenzophenone, 4,4'-dichlorobenzophenone, benzyl, benzoin, benzoin methyl ether, benzoin ethyl ether, benzoin isopropyl ether, benzoin-n-butyl ether, benzoin isobutyl ether, benzoin butyl ether, p-dimethylaminoacetophenone, p-tertbutyltrichloroacetophenone, p-tertbutyldichloroacetopheneone, thioxanthone, 2-methylthioxanthone, 2-isopropylthioxanthone, dibenzosuberon, dichloro-4-phenoxyacetophenone, pentyl-4-dimethylaminobenzoate, 9-phenylacridine, 1,7-bis-(9-acridinyl)heptane, 1,5-bis(9-acridinyl)pentane, 1,3-bis(9-acridinyl)propane, 2,4-bis-trichloromethyl-6-(3-bromo-4-methoxy)phenyl-s-triazine, 2,4-bis-trichloromethyl-6-(2-bromo-4-methoxy)phenyl-s-triazine, 2,4-bis-trichloromethyl-6-(3-bromo-4-methoxy)styrylphenyl-s-triazine, 2,4-bis-trichloromethyl-6-(2-bromo-4-methoxy)styrylphenyl-s-triazine and the like.

The amount of the photopolymerization initiator to be added is in the range of 0.1 to 40 parts by weight in a total of 100 parts by weight of such initiator and the photopolymerizable compound previously mentioned.

The light shielding film-forming photosensitive resin composition of the present invention comprises, in addition to the above noted components, light shielding materials. Those materials or third component is composed of an oxide of copper and an oxide or oxides of at least one metal selected from among iron, manganese, chromium, cobalt and nickel. Suitable light shielding materials include $Fe_2O_3 \cdot CuO$, $Fe_3O_4 \cdot CuO$, $MnO_2 \cdot CuO$, $CuO \cdot Cr_2O_3$, $CuO \cdot CoO$, $CuO \cdot NiO$, $Fe_2O_3 \cdot MnO_2 \cdot CuO$, $Fe_3O_4 \cdot MnO_2 \cdot CuO$, $MnO_2 \cdot CuO \cdot Cr_2O_3$, $MnO_2 \cdot CuO \cdot CoO$, $MnO_2 \cdot CuO \cdot NiO$, $Fe_2O_3 \cdot Fe_3O_4 \cdot MnO_2 \cdot CuO$, $Fe_2O_3 \cdot Fe_3O_4 \cdot MnO_2 \cdot CuO \cdot Cr_2O_3$, $Fe_2O_3 \cdot Fe_3O_4 MnO_2 \cdot CuO \cdot CoO$, $Fe_2O_3 \cdot Fe_3O_4 \cdot MnO_2 \cdot CuO \cdot NiO$, $Fe_2O_3 \cdot Fe_3O_4 \cdot MnO_2 CuO \cdot Cr_2O_3 \cdot CoO$, $Fe_2O_3 \cdot Fe_3O_4 \cdot MnO_2 \cdot CuO \cdot Cr_2O_3 \cdot NiO$, $Fe_2O_3 \cdot Fe_3O_4 \cdot MnO_2 CuO \cdot Cr_2O_3 \cdot CoO \cdot NiO$ and the like. Among the light shielding materials stated here, a combination system based essentially on a copper oxide, an iron oxide or iron oxides and a manganese oxide is particularly preferred which includes, for instance, $Fe_2O_3 \cdot MnO_2 \cdot CuO$, $Fe_3O_4 \cdot MnO_2 \cdot CuO$, $Fe_2O_3 \cdot Fe_3O_4 \cdot MnO_2 \cdot CuO$, $Fe_2O_3 \cdot Fe_3O_4 \cdot MnO_2 \cdot CuO \cdot CoO \cdot MnO_2 \cdot CuO \cdot Cr_2O_3$, $Fe_2O_3 \cdot Fe_3O_4 \cdot MnO_2 CuO \cdot CoO$, $Fe_2O_3 \cdot Fe_3O_4 \cdot MnO_2 \cdot CuO \cdot NiO$, $Fe_2O_3 \cdot Fe_3O_4 \cdot MnO_2 \cdot CuO \cdot Cr_2O_3 \cdot CoO$, $Fe_2O_3 \cdot Fe_3O_4 \cdot MnO_2 \cdot CuO \cdot Cr_2O_3 \cdot NiO$, $Fe_2O_3 \cdot Fe_3O_4 \cdot MnO_2 \cdot CuO \cdot Cr_2O_3 \cdot CoO \cdot NiO$ and the like.

The light shielding materials have an average particle diameter ranging preferably from 0.01 to 5 μm. Departures from this specified range make the resulting black matrix less capable of screening or shielding from visible rays. The amount of the light shielding materials to be used is in the range of 10 to 60 parts by weight based on a total of 100 parts by weight of the photopolymerizable compound and the photopolymerization initiator.

As for the formulation of the light shielding materials, the ratio of copper oxide to at least one metal oxide or oxides such as of iron, manganese, chromium, cobalt and nickel is in the range of 1:20 to 10:1, preferably of 1:9 to 6:1, respectively, on a weight basis. Ratios departing from the range of 1:20 to 10:1 fail in some cases to provide an achromatic black matrix pattern.

The photosensitive resin composition for forming light shielding films of this invention can also contain a polymer compound having film forming capabilities. This polymer compound has a role to form a film of least tack upon coating of the photosensitive resin composition onto a substrate and upon subsequent drying of the coat, and also to improve the strength of the resultant light shielding film. Eligible polymer compounds used herein are selected from copolymers such as of acrylic acid, methacrylic acid, methyl acrylate, methyl methacrylate, ethyl acrylate, ethyl methacrylate, 2-hydroxyethyl acrylate, 2-hydroxyethyl methacrylate, 2-hydroxypropyl methacrylate, N-butyl acrylate, N-butyl methacrylate, isobutyl acrylate, isobutyl methacrylate, benzyl acrylate, benzyl methacrylate, phenoxy acrylate, phenoxy methacrylate, isobornyl acrylate, isobornyl methacrylate, styrene, acrylamide, acrylonitrile and the like. Particularly preferable copolymers have acrylic acid or methacrylic acid contained in an amount of about 5 to 40% by weight, which copolymers permit alkali development of the photosensitive resin composition. In addition, cellulose resins are suitably useful which are carboxymethyl cellulose, carboxyethyl cellulose, carboxypropyl cellulose and the like, and those cellulose resins that are derivable by reacting polybasic acid anhydrides with hydroxyl groups such as of hydroxymethyl cellulose, hydroxyethyl cellulose, hydroxypropyl cellulose and the like.

The polymer compound having film forming capabilities is used preferably in an amount of 20 to 200 parts by weight based on a total of 100 parts by weight of the photopolymerizable compound and the photopolymerization initiator.

In order to gain improved color tone and light shielding properties of the light shielding film, various other inorganic pigments may be added to the photosensitive resin composition contemplated under this invention. Included in these pigments are white lead, zinc white, titanium oxide, basic sulfate, lithopone, lead sulfate, lead titanate, zirconium oxide, barytes, precipitated barium sulfate, barium carbonate, chalk, precipitated calcium carbonate, gypsum, magnesium carbonate, alumina, clay, solid stone dust, diatomaceous earth, red lead, vermilion, cadmium red, lead yellow, cadmium yellow, zinc yellow, strontium yellow, barium yellow, emerald green, cadmium green, silica, talc, tin vanadate yellow, vanadium zirconium yellow, praseodymium yellow, antimony tinnate blue, lilac and the like. There may also be used low-melting glasses (melting points are in a range of from 130° C. to 350° C.) composed of oxides of Si, B, Pb, Na, K and Mn and including for example lead borate glass, zinc borate glass and the like. Such a low-melting glass functions as sintering agents for the metallic oxides during burning treatment, and makes a black matrix structurally strong.

Other additives such as organic solvents, thermal polymerization inhibitors, defoaming agents, emulsifying agents and the like may be incorporated, where desired, in the light shielding film-forming photosensitive resin composition of the present invention.

Such an organic solvent is added to dilute the photosensitive resin composition and may be exemplified by benzene, toluene, xylene, methyl ethyl ketone, acetone, methyl isobutyl ketone, cyclohexanone, methanol, ethanol, propanol, butanol, hexanol, cyclohexanol, ethylene glycol, diethylene glycol, glycerin, ethylene glycol monomethylether, ethylene glycol monoethylether, propylene glycol monomethylether, propylene glycol monoethylether, diethylene glycol monomethylether, diethylene glycol monoethylether, diethylene glycol dimethylether, diethylene glycol diethylether, 3-methoxy butyl acetate, 3-methyl-3-methoxybutyl acetate, propylene glycol monomethylether propionate, propylene glycol monoethylether propionate, methyl carbonate, ethyl carbonate, propyl carbonate, butyl carbonate and the like. Of the listed solvents, 3-methoxybutyl acetate is particularly suitable which is highly capable not only of dissolving the soluble components present in the photosensitive resin composition, but also of dispersing the insoluble components such as pigments and the like present in that composition. The amount of the organic solvent to be used is in the range of 50 to 500 parts by weight based on a total of 100 parts by weight of the photopolymerizable compound, the photopolymerization initiator and the light shielding material.

Suitable thermal polymerization inhibitors are hydroquinone, hydroquinone methyl ether and the like, suitable defoaming agents are compounds of a silicone or fluorine type, and suitable emulsifying agents are compounds of an anionic, cationic or nonionic emulsifiers in common use, and those are capable of defoaming.

The black matrix according to the present invention may be produced by forming the photosensitive resin composition into a pattern through photolithography, followed by burning the pattern. It is necessary that the light shielding ratio of the burned pattern be 1.5 or more, preferably 2.0 or more, when measured as an optical density (hereunder called a "OD" value) and that the electrical insulation resistance of the burned pattern be $1 \times 10^8$ $\Omega/cm^2$ or more. With the OD value set to be more than the above numerical value, the black matrix of the present invention can retain images of a strong contrast as a display element. Moreover, a current leak-free display element is obtainable with a larger electrical insulation resistance than the above noted value.

The following process can be followed in producing the black matrix of this invention.

(1) Preparation of Photosensitive Resin Composition for Forming Light Shielding Films A photopolymerizable compound, a photopolymerization initiator, and light shielding materials composed of a copper oxide and an oxide or oxides of at least one metal selected from iron, manganese, chromium, cobalt and nickel, and if desired, a polymer compound having film forming capabilities, an organic solvent, a thermal polymerization inhibitor, a defoamer, an emulsifier and other additives are fully dispersed and kneaded as by a three-roll mill, a ball mill, a sand mill or the like, whereby a photosensitive resin composition for forming light shielding films is prepared.

(2) Coating of Photosensitive Resin Composition for Forming Light Shielding Films Cleaning is done with respect to a surface of a glass substrate such as of soda lime glass, low-expanding glass, non-alkali glass, silica glass or the like, or a glass substrate provided with an ITO (indium-tin-oxides) electrode. Onto the cleaned surface is coated the photosensitive resin composition prepared in item (1) above. To attain improved adhesion of the photosensitive resin composition to the substrate, a silane coupling agent may be incorporated in that composition or may be applied previously over the substrate. Coating is carried out with use of a contact type transfer coating apparatus typified by a roll coater, a reverse coater, a bar coater or the like, or of a non-contact type coating apparatus typified by a spinner, a curtain flow coater or the like. In particular, in the case of formation of a film with increased thickness, wet-on-wet coating may be employed, or two or more of the above coating apparatus may be used in combination. After completion of the coating, the coat-carrying substrate is let to stand at room temperature for from several hours to several days, or alternatively, it is placed in a warm air heater or an infrared heater for from tens of minutes to tens of hours to thereby remove the solvent used. Thus, the coat thickness is adjusted to be lie between 1 to 10 μm.

(3) Exposure Treatment

Exposure is performed to the resulting coat through a negative mask. Suitable sources of active energy, rays and the like for this exposure are from ultraviolet rays, laser beams, gamma rays and electron beams. The irradiation dose varies slightly with the nature of a photosensitive resin composition used, but may be selected within a range of 30 to 2,000 mJ/cm$^2$.

(4) Development Treatment

The exposed coat is then subjected to development with a developing solution as by immersion, spraying or a similar technique. Eligible developing solutions are chosen from hydroxides, carbonates, bicarbonates, phosphates and pyrophosphates of alkaline metals such as lithium, sodium, potassium and the like; primary amines such as benzylamine, butylamine and the like; secondary amines such as dimethylamine, dibenzylamine, diethanolamine and the like; tertiary amines such as trimethylamine, triethylamine, triethanolamine and the like, cyclic amines such as morpholine, piperazine, pyridine and the like; polyamines such as ethylenediamine, hexamethylenediamine and the like; ammonium hydroxides such as tetraethylammonium hydroxide, trimethylbenzylammonium hydroxide, trimethylphenylbenzylammonium hydroxide and the like; sulfonium hydroxides such as trimethylsulfonium hydroxide, diethylmethylsulfonium hydroxide, dimethylbenzylsulfonium hydroxide and the like; and aqueous solutions of choline.

(5) Burning Treatment

In the case where the light shielding film-forming photosensitive resin composition of the present invention is applied to a black matrix for use in a liquid crystal panel and the like, the final process step can end up with the treatment of development in item (4). Forming a black matrix for use in PDP needs a burning step. More specifically, the above developed coat is burned at a temperature of 350° to 750° C. so as to decompose and volatilize the components other than the inorganic metallic oxides contained in the photosensitive resin composition, whereby a desired black matrix is provided in the form of an inorganic light shielding layer.

With reference to the following examples, the present invention will be further described hereunder in greater detail. It is to be noted that these examples are given for illustrative purposes, but not for restrictive purposes.

EXAMPLE 1

Different compounds shown below were fully admixed to prepare a photosensitive resin composition for forming light shielding films according to the invention.

| | |
|---|---|
| $Fe_2O_3.MnO_2.CuO$ (weight ratio = $Fe_2O_3$: $MnO_2$: CuO = 1:1:1) | 40 parts by weight |
| methacrylic acid/methyl methacrylate copolymer (weight ratio (%): 25/75; weight-average molecular weight: about 25,000) | 5 parts by weight |
| trimethylpropane triacrylate | 9 parts by weight |
| 2-benzyl-2-dimethylamino-1-(4-morpholinophenyl)butane-1-one (IRGACURE 369; Ciba-Gaigy Co.) | 2 parts by weight |
| diethylthioxanthone | 2 parts by weight |
| 3-methoxybutyl acetate | 55 parts by weight |

These compounds were dispersed and kneaded with a three-roll mill for 2 hours.

Onto a clean surface of a 3 mm-thick glass substrate was coated the resulting photosensitive resin composition in a dry coat thickness of 2 μm with use of a reverse coater (Round Coater; Dainippon Screen Co. Ltd.). The coat was dried at 80° C. for one minute, followed by exposure with selective ultraviolet irradiation at a dose of 800 mJ/cm$^2$ and by subsequently burning at 540° C. for 30 minutes in an electric furnace. When the substrate thus treated was irradiated on its back side with light rays supplied from a three-wavelength fluorescent tube for using a black light of light-crystal panel, it was found that an excellent black film had been formed without color shading and other defects involved. The OD value of such film was determined to be 2.5 as measured with an instrument, "PDA-65" (Konica Co. Ltd.). Examination of the film using an instrument, "Hi Rester" (Mitsubishi Chemical Co. Ltd.), revealed an electrical insulation resistance of 8.51×10$^9$ Ω/cm$^2$. A similar photosensitive resin composition for forming light shielding films was coated and dried on a similar glass substrate, followed by exposure of the resulting coat through a negative mask. After being developed at 25° C. for 90 seconds with use of an aqueous solution of 2% sodium carbonate, the coat was then burned. Thus, a good black matrix was obtainable which was immune from flawing, peeling and discoloration in the exposed region and also was absent from adverse residues in the unexposed region.

COMPARATIVE EXAMPLE 1

The procedure of Example 1 was repeated except that carbon black was used in place of $Fe_2O_3.MnO_2.CuO$. Thus, a photosensitive resin composition for forming light shielding films was prepared for use in comparative testing. Onto a glass substrate was coated the photosensitive resin composition in a dry coat thickness of 2 μm, and the coat so obtained was dried and exposed with overall ultraviolet irradiation at a dose of 800 mJ/cm$^2$. The burning was thereafter conducted at 540° C. for 30 minutes in an electric furnace. The carbon black contained in the photosensitive resin composition got decomposed and oxidized so that no traces of that material remained left on the substrate.

EXAMPLE 2

Different compounds listed below were fully admixed to prepare a light shielding film-forming photosensitive resin composition according to the invention.

| | |
|---|---|
| $Cr_2O_3.CoO.CuO$ (weight ratio = $Cr_2O_3$: CoO: CuO = 3:2:1) | 10 parts by weight |
| Methacrylic acid/methyl methacrylate copolymer (weight ratio (%): 25/75; weight-average molecular weight: about 25,000) | 15 parts by weight |
| Trimethylpropane triacrylate | 9 parts by weight |

-continued

| | |
|---|---|
| 2-benzyl-2-dimethylamino-1-(4-morpholinophenyl)butane-1-one (same as in Example 1) | 2 parts by weight |
| Diethylthioxanthone | 2 parts by weight |
| 3-methoxybutyl acetate | 55 parts by weight |

These compounds were dispersed and kneaded with a three-roll mill for 2 hours.

Onto a clean surface of a 3 mm-thick glass substrate was coated the resulting photosensitive resin composition in a dry coat thickness of 2 μm with use of a reverse coater (same as in Example 1). The coat was dried at 80° C. for one minute, followed by exposure with overall ultraviolet irradiation at a dose of 800 mJ/cm$^2$ and by subsequently burning at 540° C. for 30 minutes in an electric furnace. When the substrate thus treated was irradiated on its back side with light rays supplied from a three-wavelength fluorescent tube, it was found that an excellent black film had been formed without color shading and other defects involved. The OD value of such film was determined to be 1.8 as measured with aninstrument "PDA-65" (same as in Example 1). Measurement of the film using an instrument "Hi Rester" (same as in Example 1) revealed an electrical insulation resistance of $5.38 \times 10^{11}$ Ω/cm$^2$. A similar photosensitive resin composition for forming light shielding films was coated and dried on a similar glass substrate, followed by exposure of the resulting coat through a negative mask. The coat was developed at 25° C. for 90 seconds by use of an aqueous solution of 2% sodium carbonate and then burned. Thus, a good black matrix was provided which was free from flawing, peeling and discoloration in the exposed region and also from undesirable residues in the unexposed region.

EXAMPLE 3

Different compounds shown below were fully admixed to prepare a photosensitive resin composition for forming light shielding films according to the invention.

| | |
|---|---|
| Fe$_2$O$_3$.NiO$_2$.CuO (weight ratio = Fe$_2$O$_3$: NiO$_2$: CuO = 3:3:1) | 50 parts by weight |
| Methacrylic acid/methyl methacrylate copolymer (weight ratio (%): 25/75; weight-average molecular weight: about 25,000) | 15 parts by weight |
| Trimethylpropane triacrylate | 9 parts by weight |
| 2-benzyl-2-dimethylamino-1-(4 morpholinophenyl)butane-1-one (same as in Example 1) | 2 parts by weight |
| Diethylthioxanthone | 2 parts by weight |
| 3-methoxybutyl acetate | 55 parts by weight |

These compounds were dispersed and kneaded with a three-roll mill for 2 hours.

Onto a clean surface of a 3 mm-thick glass substrate was coated the resulting photosensitive resin composition in a dry coat thickness of 2 μm with use of a reverse coater (same as in Example 1). The coat was dried at 80° C. for one minute, followed by exposure with overall ultraviolet irradiation at a dose of 800 mJ/cm$^2$ and by subsequently burning at 540° C. for 30 minutes in an electric furnace. When the substrate thus treated was irradiated on its back side with light rays supplied from a three-wavelength fluorescent tube, it was found that an excellent black film had been formed without color shading and other defects involved. The OD value of such film was determined to be 2.8 as measured with an instrument "PDA-65" (same as in Example 1). Inspection of the film using an instrument "Hi Resters" (same as in Example 1) showed an electrical insulation resistance of $2.84 \times 10^9$ Ω/cm$^2$. A similar photosensitive resin composition for forming light shielding films was coated and dried on a similar glass substrate, followed by exposure of the resulting coat through a negative mask. The coat was developed at 25° C. for 90 seconds with use of an aqueous solution of 2% sodium carbonate and then burned. Thus, a good black matrix was obtained without involving objectionable flawing, peeling and discoloration in the exposed region, and adverse residues in the unexposed region.

As will be readily understood by those skilled in the art, various modifications and variations may be made without departing from the scope of the appended claims.

What is claimed is:

1. A photosensitive resin composition for forming light shielding films comprising a photopolymerizable compound, a photopolymerization initiator, and light shielding materials composed of an oxide of copper and an oxide or oxides of at least one metal selected from the group consisting of iron, manganese, chromium, cobalt and nickel.

2. The photosensitive resin composition according to claim 1, wherein said photopolymerizable compound contains in its molecule an ethylenically unsaturated double bond.

3. The photosensitive resin composition according to claim 1, wherein said light shielding materials are composed of a copper oxide, an iron oxide and a manganese oxide.

4. The photosensitive resin composition according to claim 1, wherein said light shielding materials have an average particle diameter of 0.01 to 5 μm.

5. The photosensitive resin composition according to claim 1, wherein the weight ratio of copper oxide to an oxide or oxides of at least one metal selected from iron, magnanese, chromium, cobalt and nickel is in the range of 1:20 to 10:1.

6. The photosensitive resin composition according to claim 1, wherein said light shielding materials are contained in an amount of 10 to 600 parts by weight based on a total of 100 parts by weight of said photopolymerizable compound and said photopolymerization initiator.

7. The photosensitive resin composition according to claim 1, which further includes at least one member selected from the group consisting of an inorganic pigment and a low-melting glass in an amount sufficient to improve the color shade and light shielding of a light shielding film to be formed.

8. The photosensitive resin composition according to claim 1, which further includes a polymer compound having film forming capabilities.

9. The photosensitive resin composition of claim 1, wherein the light shielding materials are one or more oxides selected from the group consisting of Fe$_2$O$_3$.CuO, Fe$_3$O$_4$.CuO, MnO$_2$.CuO, CuO.Cr$_2$O$_3$, CuO.CoO, CuO.NiO, Fe$_2$O$_3$.MnO$_2$.CuO, Fe$_3$O$_4$.MnO$_2$.CuO, MnO$_2$.CuO.Cr$_2$O$_3$, MnO$_2$.CuO.CoO, MnO$_2$.CuO.NiO, Fe$_2$O$_3$.Fe$_3$O$_4$.MnO$_2$.CuO, Fe$_2$O$_3$.Fe$_3$O$_4$.MnO$_2$.CuO.Cr$_2$O$_3$, Fe$_2$O$_3$.Fe$_3$O$_4$.MnO$_2$.CuO.CoO, Fe$_2$O$_3$.Fe$_3$O$_4$.MnO$_2$.CuO.NiO, Fe$_2$O$_3$.Fe$_3$O$_4$.MnO$_2$.CuO.Cr$_2$O$_3$.CoO, Fe$_2$O$_3$.Fe$_3$O$_4$.MnO$_2$.CuO.Cr$_2$O$_3$.NiO, and Fe$_2$O$_3$.Fe$_3$O$_4$.MnO$_2$.CuO.Cr$_2$O$_3$.CoO.NiO.

10. The photosensitive resin composition of claim 3 wherein the light shielding materials are selected from the group consisting of Fe$_2$O$_3$.MnO$_2$.CuO, Fe$_3$O$_4$.MnO$_2$.CuO, Fe$_2$O$_3$.Fe$_3$O$_4$.MnO$_2$.CuO..

$Fe_2O_3 \cdot Fe_3O_4 \cdot MnO_2 \cdot CuO \cdot Cr_2O_3$,
$Fe_2O_3 \cdot Fe_3O_4 \cdot MnO_2 \cdot CuO \cdot CoO$,
$Fe_2O_3 \cdot Fe_3O_4 \cdot MnO_2 \cdot CuO \cdot NiO$,
$Fe_2O_3 \cdot Fe_3O_4 \cdot MnO_2 \cdot CuO \cdot Cr_2O_3 \cdot CoO$,
$Fe_2O_3 \cdot Fe_3O_4 \cdot MnO_2 \cdot CuO \cdot Cr_2O_3 \cdot NiO$, and
$Fe_2O_3 \cdot Fe_3O_4 \cdot MnO_2 \cdot CuO \cdot Cr_2O_3 \cdot CoO \cdot NiO$.

11. A black matrix comprising a metallic oxide layer formed of a photosensitive resin composition for forming light shielding films comprising a photopolymerizable compound, a photopolymerization initiator, and light shielding materials composed of an oxide of copper and an oxide or oxides of at least one metal selected from the group consisting of iron, manganese, chromium, cobalt and nickel.

12. The black matrix according to claim 11, which the optical density value of the black matrix is 1.5 or more and the electrical insulation resistance thereof is $1 \times 10^8$ $\Omega/cm^2$ or more.

13. A method for producing a black matrix, which method comprises the steps of:

(a) coating a photosensitive resin composition for forming light shielding films onto a substrate, said resin composition for forming light shielding films comprising a photopolymerizable compound, a photopolymerization initiator, and light shielding materials composed of an oxide of copper and an oxide or oxides of at least one metal selected from the group consisting of iron, manganese, chromium, cobalt and nickel;

(b) drying the resultant coat;

(c) exposing the dried coat to selective irradiation with active light rays; and (d) subsequently developing the exposed coat to form a pattern therein.

14. A method for producing a black matrix for use in a plasma display, which method comprises the steps of:

(a) coating a photosensitive resin composition for forming light shielding films onto a substrate, said resin composition comprising a photopolymerizable compound, a photopolymerization initiator, and light shielding materials composed of an oxide of copper and an oxide of or oxides at least one metal selected from the group consisting of iron, manganese, chromium, cobalt and nickel;

(b) drying the resultant coat;

(c) exposing the dried coat to selective irradiation with active light rays;

(d) developing the exposed coat to form a pattern therein; and (e) subsequently burning the resultant pattern at a temperature of 350° to 750° C.

* * * * *